US009293890B2

(12) United States Patent
Breeze et al.

(10) Patent No.: US 9,293,890 B2
(45) Date of Patent: Mar. 22, 2016

(54) DEVICE AND METHOD FOR GENERATING STIMULATED EMISSION OF MICROWAVE OR RADIO FREQUENCY RADIATION

(71) Applicant: IMPERIAL INNOVATIONS LIMITED, London (GB)

(72) Inventors: Jonathan David Baxendale Breeze, London (GB); Neil McNeill Alford, London (GB)

(73) Assignee: Imperial Innovations Limited, London (GB)

( * ) Notice: Subject to any disclaimer, the term of this patent is extended or adjusted under 35 U.S.C. 154(b) by 0 days.

(21) Appl. No.: 14/403,209

(22) PCT Filed: May 24, 2013

(86) PCT No.: PCT/GB2013/051385
§ 371 (c)(1),
(2) Date: Nov. 24, 2014

(87) PCT Pub. No.: WO2013/175235
PCT Pub. Date: Nov. 28, 2013

(65) Prior Publication Data
US 2015/0103859 A1    Apr. 16, 2015

(30) Foreign Application Priority Data

May 25, 2012  (GB) .................................. 1209246.6

(51) Int. Cl.
*H01S 1/02*      (2006.01)
*H01S 4/00*      (2006.01)
*G01R 33/343*    (2006.01)
*H01P 7/08*      (2006.01)

(52) U.S. Cl.
CPC ................ *H01S 4/00* (2013.01); *G01R 33/343* (2013.01); *H01P 7/08* (2013.01); *H01S 1/02* (2013.01)

(58) Field of Classification Search
CPC ............. H01S 4/00; H01S 1/005; H01S 1/02; H03C 7/00; H03C 7/02; H03C 7/022; H03C 7/025; H03D 7/00; H01P 7/00; G01R 33/343; H01Q 15/0086
USPC .............................................. 331/94.1; 330/4
See application file for complete search history.

(56) References Cited

U.S. PATENT DOCUMENTS 2,909,654 A   10/1959  Bloembergen
4,446,429 A    5/1984  Froncisz et al.
(Continued)

FOREIGN PATENT DOCUMENTS

CN       102013537       4/2011
EP        0503624        9/1992
(Continued)

OTHER PUBLICATIONS

Gil et al., "Tunable sub-wavelength resonators based on barium-strontium-titanate thick-film technology", IET microwaves, antennas & propagation 5.3 (2011): 316-323.*
(Continued)

*Primary Examiner* — Ryan Johnson
(74) *Attorney, Agent, or Firm* — Kirschstein, Israel, Schiffmiller & Pieroni, P.C.

(57) ABSTRACT

A device for, and a method of, generating stimulated emission of microwave or radio frequency electromagnetic radiation, utilize a resonator structure, an input source of microwave or radio frequency electromagnetic radiation to be amplified, and an input of energy arranged to pump the resonator structure and thereby cause amplification of the electromagnetic radiation. The configuration of the resonator structure and/or the materials used in its construction give rise to an increase in the magnetic Purcell factor of the resonator structure.

24 Claims, 2 Drawing Sheets

(56) References Cited

U.S. PATENT DOCUMENTS

| | | | |
|---|---|---|---|
| 6,133,800 A | 10/2000 | Deng | |
| 7,205,941 B2 * | 4/2007 | Wang et al. | ............ 343/700 MS |
| 2007/0114431 A1 | 5/2007 | Wang | |

FOREIGN PATENT DOCUMENTS

| | | |
|---|---|---|
| JP | 2001102194 | 4/2001 |
| WO | 0178201 | 10/2001 |
| WO | 2010032023 | 3/2010 |

OTHER PUBLICATIONS

Ygal Twig et al, "Sensitive surface loop-gap microresonators for electron spin resonance", Review of Scientific Instruments, vol. 81, No. 10, p. 104703 (2010).

Kazuyuki Takeda et al., "Zero-field electron spin resonance and theoretical studies of light penetration...", The Journal of Chemical Physics, vol. 117, No. 10, p. 4940 (2002).

Aharon Blank et al., "Transparent miniature dielectric resonator for electron parametric resonance experiments", Review of Scientific Experiments, vol. 74, No. 5, pp. 2853-2859 (2003).

Blank, A. & Levanon, H., "Toward maser action at room temperature by triplet-radical interaction and its application to microwave technology", RIKEN Review 44, pp. 128-130, (Feb. 2002).

Sato et al., "A Multilayered Element Resonator for CW-ESR and Longitudinally Detected ESR at Radio Frequency", Appl. Magn. Reson. 17, pp. 119-131 (1999).

Hardy and Whitehead, "Split-Ring Resonator for use in Magnetic Resonance from 200-2000 MHz", Rev. Sci. Instrum., vol. 52, No. 2, pp. 213-216 (Feb. 1981).

\* cited by examiner

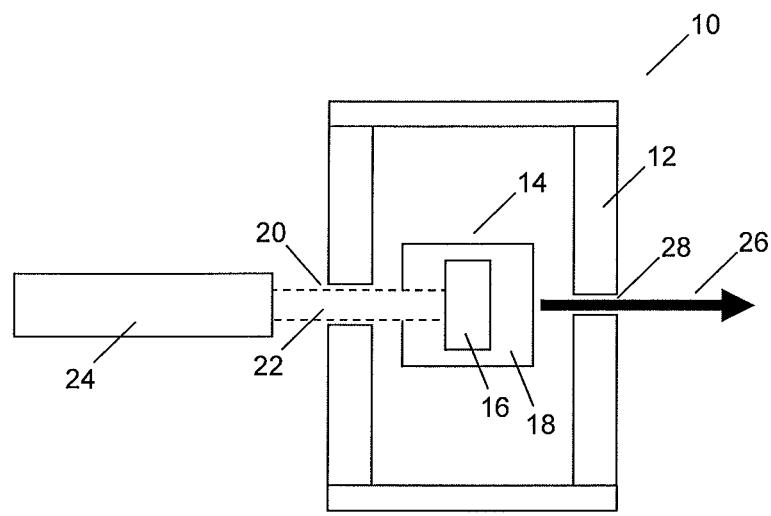
Figure 1
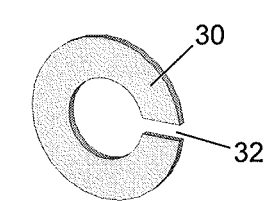
Fig. 2a
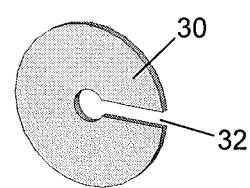
Fig. 2b
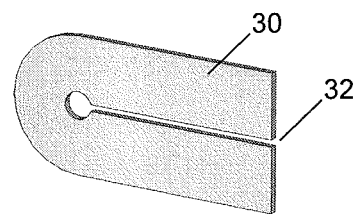
Fig. 2c
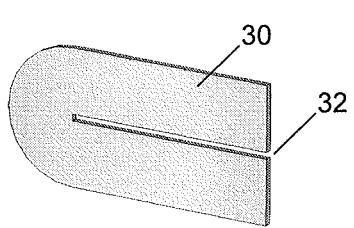
Fig. 2d
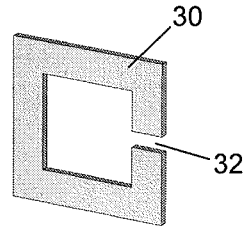
Fig. 2e
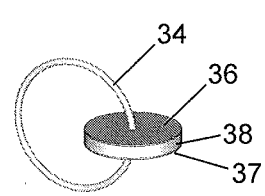
Fig. 2f
Figure 2

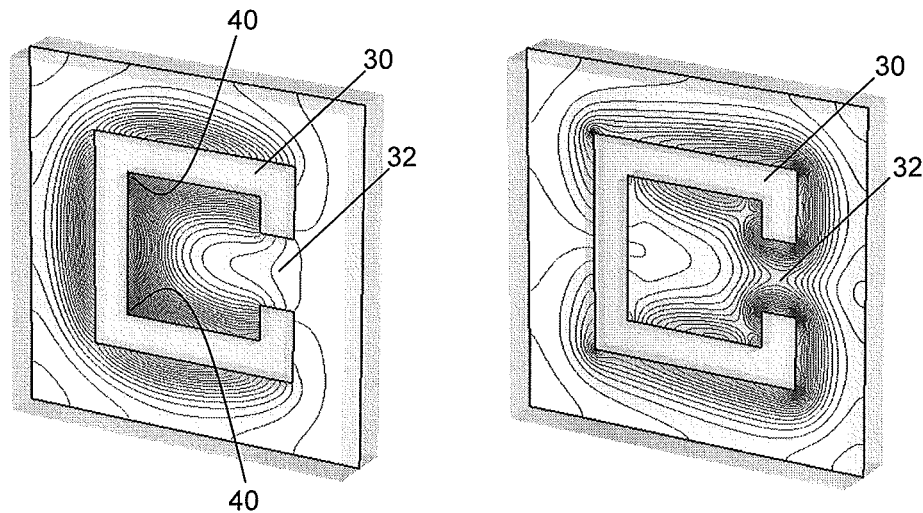
Magnetic field magnitude      Electric field magnitude
Fig. 3a      Fig. 3b
Figure 3
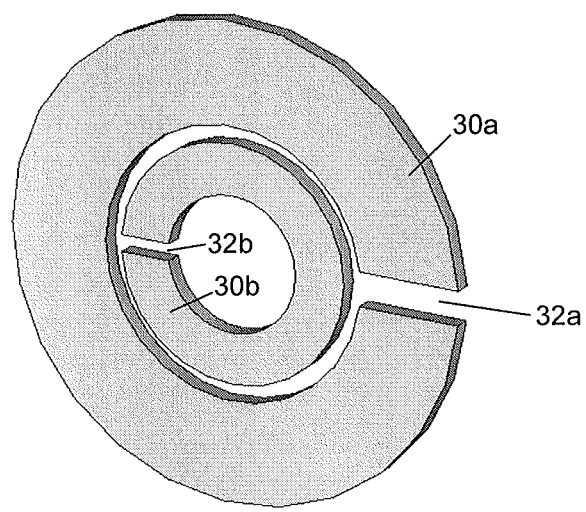
Figure 4

DEVICE AND METHOD FOR GENERATING STIMULATED EMISSION OF MICROWAVE OR RADIO FREQUENCY RADIATION

FIELD OF THE INVENTION

The present invention relates to resonant structures, in particular (but by no means limited) for use in masers, and materials for use in such structures.

BACKGROUND TO THE INVENTION

The maser (Microwave Amplification by the Stimulated Emission of Radiation) is in fact the forerunner of the laser (Light Amplification by the Stimulated Emission of Radiation), and was discovered around 50 years ago by Townes, Basov and Prokhorov who shared the 1964 Nobel Prize in Physics for this work. A laser can be thought of simply as maser that works with higher frequency photons in the visible light spectrum, whereas a maser works at microwave frequencies. Both systems rely on chemical species with an excited energy-level population being stimulated into lower energy levels, either by photons or collisions with other species. Photons are coherently emitted by the stimulated atom or molecule, in addition to the original photons that entered the system at the same frequency, meaning that a strong beam of monochromatic radiation is produced.

Although lasers appeared after masers, they are manufactured in their billions and have found their way into applications in all sectors of industry and modern-day life from DVD players to laser eye surgery. Masers, on the other hand, are used only in very specialised applications such as atomic clocks and as amplifiers in radiofrequency telescopes.

There are two key reasons why masers have not been widely adopted. The maser process only works efficiently and continuously below a temperature of ~20K. This means that either liquid cryogens or cryo-coolers must be used. The gain of a maser amplifier typically saturates at a low signal power (typically −40 dBm). They can thus only be used as preamplifiers of weak signals and not as power amplifiers. To work at a particular frequency, a d.c. magnetic field must be applied to the maser, limiting the frequency to a few tens of MHz. Thus, a maser amplifier has sufficient bandwidth to amplify a single non-compressed video signal but little more. Compared with the GHz bandwidths offered by semiconductor-based microwave amplifiers, masers are restrictively narrow-band devices. Applying the magnetic field means using bulky electromagnets and water cooling or using superconducting magnets at cryogenic temperatures. Both are bulky and power hungry.

Research by Blank et al [1] considered the realisation of optically-pumped masers at room temperature using organic polyaromatic hydrocarbon molecules such as $C_{60}$ and porphyrins, placed within strong d.c. magnetic fields. These molecules exhibit very long spin-polarization lifetimes. Importantly, the authors believed that the so-called "triplet mechanism" would not produce masing at room temperature.

An equation can be simply derived that governs maser action for continuous-wave optical pumping, as follows:

$$\left(\frac{\mu_0 \gamma^2}{\pi c_0}\right) \cdot \underbrace{\kappa P_{opt} \lambda}_{optical} \cdot \underbrace{T_1 T_2 \eta_{ISC} \Delta N}_{triplet} \cdot \underbrace{F_m}_{resonator} > 1$$

where $\mu_0$ is the permeability of free-space, $\gamma$ is the electron gyromagnetic ratio, $\kappa$ is the optical coupling efficiency, $P_{opt}$ is the optical pumping power with wavelength $\lambda$, $T_1$ is the triplet inversion lifetime (spin-lattice relaxation), $T_2$ is the spin-spin relaxation time, $\eta_{ISC}$ is the intersystem crossing yield from the excited $S_1$ state, $\Delta N$ is the difference in normalised populations of the triplet inversion, $F_m$ is the magnetic Purcell factor (defined as $Q/V_m$, where Q is the Q-factor and $V_m$ is the magnetic mode volume) and $c_0$ is the speed of light in vacuum.

From this equation it can be seen that three factors contribute towards achieving maser action: the optical pumping system, the triplet-state molecules and the resonator Purcell factor. For a given molecular system providing an inverted population of triplet-states, the optical pumping power required to achieve threshold is inversely proportional to the magnetic Purcell factor and hence by maximising this, the optical pumping power required can be reduced.

The present work seeks to increase the magnetic Purcell factor, and thereby reduce the optical pumping power required, by virtue of the configuration of the resonator structure and/or the materials used in its construction.

Although, in the present work, the structures and materials are primarily described in relation to masers (i.e. to generate stimulated emission of microwave radiation), it is to be emphasised that they may also be used to generate stimulated emission of electromagnetic radiation at other wavelengths, in particular at radio frequencies.

SUMMARY OF THE INVENTION

According to a first aspect of the present invention there is provided a device as defined in Claim 1 of the appended claims. Thus there is provided a device for generating stimulated emission of microwave or radio frequency electromagnetic radiation, the device comprising: a resonator structure comprising a resonant element and a gain medium; an input source of microwave or radio frequency electromagnetic radiation to be amplified; and an input of energy arranged to pump the resonator structure and thereby cause amplification of the electromagnetic radiation; wherein the resonant element comprises an electrically inductive metallic loop structure having one or more half-turns, and an electrically capacitive structure.

The microwave or radio frequency electromagnetic radiation as referred to herein may have a frequency in the range of 1 kHz to 300 GHz, with 1 kHz corresponding to extremely low frequency radio waves, and 300 GHz corresponding to microwaves or extremely high frequency radio waves.

Forming the resonant element to include an electrically inductive metallic loop structure and an electrically capacitive structure advantageously enhances the magnetic Purcell factor of the resonator structure and thereby reduces the optical pumping power required.

Optional features are defined in the dependent claims.

Thus, the resonant element may comprise a split-ring, hairpin or LC resonator. The electrically capacitive structure may comprise a gap or slot, or parallel plates. The electrically inductive metallic loop structure may be formed as a conductive metallic layer, for example from gold, silver or copper. The metallic layer may be deposited on, or otherwise disposed on, a substrate.

The substrate may comprise a material having a high relative permittivity and a low dielectric loss. Preferably the substrate comprises a material having a relative permittivity greater than 10, and even more preferably greater than 20.

Advantageously, the use of a high permittivity material increases the capacitance of the structure, thus reducing the resonant frequency.

The substrate may comprise a dielectric medium, for example, but not limited to, alumina, titanium dioxide or strontium titanate, in single crystal or polycrystalline ceramic form. The substrate could alternatively comprise a polymer or polymer composite material, or a metal or metallodielectric structure, or could be made from conventional printed circuit board or FR4 (glass-reinforced epoxy laminate) printed circuit board material.

The electrically inductive metallic loop structure may be a first electrically inductive metallic loop structure, and the resonant element may further comprise a second electrically inductive metallic loop structure arranged within the first electrically inductive metallic loop structure. The first and second electrically inductive loop structures may be arranged concentrically, with each comprising a respective gap or slot, the respective gaps or slots being arranged on mutually opposing sides of the resonant element. This arrangement gives a reduction in the resonant frequency due to additional inductance provided by the second electrically inductive metallic loop structure and the capacitance between the first and second loops. It also provides a more symmetrically distributed magnetic field density within the resonant element.

The resonator structure may further comprise a gain medium disposed within the resonant element. Preferably the gain medium is situated in one or more regions of relatively high magnetic field density within the resonant element.

The gain medium may contain matter with a long-lived triplet state, such as a polyaromatic hydrocarbon (e.g. p-terphenyl doped with pentacene).

According to a second aspect of the present invention there is provided a device for generating stimulated emission of microwave or radio frequency electromagnetic radiation, the device comprising: a resonator structure comprising a gain medium disposed within a resonant element; an input source of microwave or radio frequency electromagnetic radiation to be amplified; and an input of energy arranged to pump the gain medium and thereby cause amplification of the electromagnetic radiation; wherein the resonant element comprises a material having a high relative permittivity and a low dielectric loss; the resonant element comprising a material having a relative permittivity greater than 13.

Advantageously, the use of a material with a high relative permittivity increases the capacitance of the resonant element, thus reducing its resonant frequency.

With both the above aspects of the invention, the stimulated emission of electromagnetic radiation may be at a microwave frequency or a radio frequency. The input of energy arranged to pump the resonator structure may be, for example, a laser, a light-emitting diode, or an electrical input such as to provide electrical pumping.

The device may further comprise temperature stabilisation or thermal management means, for example but not limited to a Peltier element, a Stirling cycle cooler, a pulse tube cooler, forced air or gas cooling, or a Gifford-McMahon cooler.

The device may further comprise an outer casing around the resonant element. Alternatively, no outer casing may be provided. If an outer casing is used, then it preferably comprises an electrically conducting material.

To enable the transition frequency of the triplet state of the gain medium to be tuned, the device may further comprise means for applying a magnetic field to the gain medium, such as a permanent magnet (e.g. made of ferrite or neodymium iron boron), or a coil in close proximity to the gain medium through which an electric current may be passed.

Moreover, the device may further comprise means for tuning the resonant frequency of the overall resonator structure, such as an adjustable wall or a tuning screw.

According to a third aspect of the present invention there is provided a method of generating stimulated emission of microwave or radio frequency electromagnetic radiation, the method comprising: providing a resonator structure comprising a resonant element and a gain medium; supplying, to the resonator structure, microwave or radio frequency electromagnetic radiation to be amplified; and pumping the resonator structure with an input of energy and thereby causing amplification of the electromagnetic radiation; wherein the resonant element comprises an electrically inductive metallic loop structure having one or more half-turns, and an electrically capacitive structure.

According to a fourth aspect of the present invention there is provided a method of generating stimulated emission of microwave or radio frequency electromagnetic radiation, the method comprising: providing a resonator structure comprising a gain medium disposed within a resonant element; supplying, to the resonator structure, microwave or radio frequency electromagnetic radiation to be amplified; and pumping the resonator structure with an input of energy and thereby causing amplification of the electromagnetic radiation; wherein the gain medium contains matter with a long-lived triplet state, and/or the resonant element comprises a material having a high relative permittivity and a low dielectric loss.

According to a fifth aspect of the present invention there is provided a device for generating stimulated emission of microwave or radio frequency electromagnetic radiation, the device comprising: a resonator structure comprising a gain medium disposed within a resonant element; an input source of microwave or radio frequency electromagnetic radiation to be amplified; an input of energy arranged to pump the gain medium and thereby cause amplification of the electromagnetic radiation; and means for applying a magnetic field to the gain medium.

According to a sixth aspect of the present invention there is provided a method of generating stimulated emission of microwave or radio frequency electromagnetic radiation, the method comprising: providing a resonator structure comprising a gain medium disposed within a resonant element; supplying, to the resonator structure, microwave or radio frequency electromagnetic radiation to be amplified; pumping the gain medium with an input of energy and thereby causing amplification of the electromagnetic radiation; and applying a magnetic field to the gain medium.

According to a seventh aspect of the present invention there is provided a device for generating stimulated emission of microwave or radio frequency electromagnetic radiation, the device comprising: a resonator structure comprising a gain medium disposed within a resonant element; an input source of microwave or radio frequency electromagnetic radiation to be amplified; an input of energy arranged to pump the gain medium and thereby cause amplification of the electromagnetic radiation; and means for tuning the resonant frequency of the resonator structure.

Finally, according to an eighth aspect of the present invention there is provided a method of generating stimulated emission of microwave or radio frequency electromagnetic radiation, the method comprising: providing a resonator structure comprising a gain medium disposed within a resonant element; supplying, to the resonator structure, microwave or radio frequency electromagnetic radiation to be amplified; pumping the gain medium with an input of energy and thereby causing amplification of the electromagnetic radiation; and tuning the resonant frequency of the resonator structure.

BRIEF DESCRIPTION OF THE DRAWINGS

Embodiments of the invention will now be described, by way of example only, and with reference to the drawings in which:

FIG. 1 illustrates a schematic diagram of a maser (not to scale);

FIG. 2 illustrates schematic examples of split-ring, hairpin and LC resonant elements;

FIG. 3 illustrates the absolute magnitude of magnetic and electric field energy distribution for a rectangular split-ring resonant element; and FIG. 4 illustrates a schematic example of a dual split-ring resonant element.

DETAILED DESCRIPTION OF PREFERRED EMBODIMENTS

The present embodiments represent the best ways known to the applicants of putting the invention into practice. However, they are not the only ways in which this can be achieved.
Overview of Maser Structure By way of an initial overview, FIG. 1 schematically illustrates a maser structure 10 known in general terms from the prior art [1]. Provided within an outer casing 12 is a resonator structure 14 that includes a gain medium 16 disposed within a resonant element 18. The outer casing 12 has an inlet 20 arranged to receive an input of energy 22 provided by a source 24.

Also provided is an input source of electromagnetic radiation (not illustrated), at microwave or radio frequency, coupled to the resonator structure 14 and to be amplified by the resonator structure 14 in order to produce a maser output.

The input of energy 22 is arranged to pump the resonator structure 14, in particular the gain medium 16, to cause stimulated emission within the resonant element 18. This produces a masing effect, causing amplification of the microwave or radio frequency radiation field within the resonant structure. The amplified microwave or radio frequency radiation is coupled (magnetically or electrically) to a transmission line 26 via an outlet (iris) 28 or coupling device in the outer casing 12.

The input of energy 22 may be a beam of light, for which the source 24 may be a laser or a light emitting diode. In our work, we have used a pulsed dye laser as the source 24, providing a laser beam with a wavelength of approximately 585 nm as the input of energy 22.

Alternatively, the input of energy may be an electrical input such as to provide electrical pumping of the gain medium 16.

By virtue of the configuration of the resonator structure 14 and/or the materials used in its construction, we have found that is possible to increase the magnetic Purcell factor of the resonator structure and thereby reduce the optical pumping power required. The following structures, materials and principles may be used, separately or in any combination, to suit the intended application.
Resonator Structures The resonator structure 14 may comprise a resonant element 18 surrounding a gain medium 16. More particularly, the gain medium 16 may be cylindrical in shape, with the resonant element 18 being ring-shaped or toroidal and coaxially surrounding the cylindrical gain medium 16 (i.e. the gain medium 16 being slotted inside the resonant element 18).

However, we have found that certain other types of resonator structure 14 can hugely enhance the magnetic Purcell factor, thereby enabling the possibility of masing at remarkably low power inputs of the order of watts or even less. The enhancement is caused by confinement of the microwave field on a very small scale. Although the Q-factors of these resonators are low compared with dielectric resonators (of the order of 100-1000), the mode volumes are orders of magnitude lower. This is understood in certain electron spin resonance (ESR) experiments, and for example Twig et al [2] show that very small mode volume resonators can exhibit very high microwave fields for a given input power. In the ESR field this is known as the power conversion ratio and is proportional to the square root of the magnetic Purcell factor.

Surprisingly, we have found that an increase in the magnetic Purcell factor can be obtained by forming the resonator structure 14 such that it includes (but is not limited to) a resonant element 18 comprising an electrically inductive metallic loop structure having one or more half-turns, and an electrically capacitive structure such as a gap or slot, or two or more parallel plates.

Examples of such resonant elements are illustrated in FIG. 2. In the literature these resonators are known as loop-gap (ESR) or split-ring resonators. The one or more half-turns of metal provide an inductance L, and the gap, slot or parallel plates provide a capacitance C, both of which allow the structure to resonate at a particular frequency, usually roughly given by $(LC)^{-1/2}$.

FIG. 2 shows a number of examples of split-ring, hairpin and LC resonant elements. More particularly, FIGS. 2a and 2b are examples of circular split-ring structures, FIGS. 2c and 2d are examples of hairpin structures, and FIG. 2e is an example of a rectangular split-ring structure. In each of FIGS. 2a to 2e, the inductive loop structure is formed as a metallic layer 30, and the capacitive structure is provided by the gap or slot 32 in the loop. FIG. 2f is an example of an LC resonator in which the inductive loop structure is a metallic ring 34 and the capacitive structure is a pair of parallel plates 36, 37. The plates 36, 37 may be separated by a dielectric layer 38. More than two parallel plates may be used to form the capacitive structure. For example, an interdigitated arrangement of plates or layers may be used.

The capacitance of the resonant element can be increased through the use of a high permittivity dielectric.

The electrically inductive metallic loop structure may be formed of any suitable material (for example, gold, silver or copper) and may be deposited on, or otherwise disposed on, a substrate. The substrate may comprise, but is not limited to, alumina, titanium dioxide or strontium titanate, in single crystal or polycrystalline ceramic form. The substrate could alternatively comprise a polymer or polymer composite material, or a metal or metallodielectric structure, or could be made from conventional printed circuit board or FR4 (glass-reinforced epoxy laminate) printed circuit board material.

The resonant element 18 (e.g. one selected from FIGS. 2a to 2f) is preferably (but not necessarily) housed within a metallic conductive casing.

A gain medium 16 is also provided, associated with the resonant element 18.

FIG. 3 illustrates the absolute magnitude of magnetic and electric field energy distribution for a rectangular split-ring resonant element 30 of the form shown in FIG. 2e. FIG. 3a shows the magnetic field energy density of the split-ring resonant element, and FIG. 3b shows the corresponding electric field energy density. From FIG. 3a it can be seen that there is a high magnetic field energy density in the innermost internal corners 40 of the split-ring 30. On the other hand, from FIG. 3b it can be seen that the electric field energy density is low in the corners of the split-ring 30, and instead is located around the gap 32.

With a resonant element of the form shown in FIGS. 2e and 3, the gain medium 16 is preferably situated in the regions of relatively high magnetic field density within the resonant element—i.e. at the innermost internal corners 40 of the split-ring 30.

FIG. 4 shows a further example of a resonant element 18—more particularly, a dual split-ring resonant element. This comprises two concentric inductive loop structures formed as metallic layers 30a, 30b, each having a respective capacitive slot or gap 32a, 32b situated on opposite sides. An advantage of this structure is that it gives a reduction in the resonant frequency due to additional inductance provided by the second split-ring and the capacitance between the rings. Also, the magnetic field density within this type of resonant element is more symmetrically distributed.

Materials for the Resonator Structure

In addition to modifying the design of the resonator structure 14 as discussed above, we have found that the magnetic Purcell factor of the resonator structure 14 can be significantly increased by the use of certain materials in its construction, as follows:

Materials for the Gain Medium

The efficacy of the gain medium 16 may be improved by fabricating it such that it contains matter with a long-lived triplet state. For example, the gain medium 16 may include a polyaromatic hydrocarbon.

In our presently preferred embodiments the gain medium 16 comprises a crystal of p-terphenyl doped with pentacene ($C_{22}H_{14}$), pentacene being one such example of a polyaromatic hydrocarbon.

Materials for the Resonant Element

The efficacy of the resonant element 18 may be improved by including a material having a high relative permittivity and a low dielectric loss. For example, the resonant element may comprise a dielectric medium, for example but not limited to a single crystal dielectric material.

Quantitatively, the relative permittivity of the resonant element 18 may be greater than 13. Having a high relative permittivity is advantageous as, for a fixed frequency, it enables the dimensions of the structure to be reduced by a factor proportional to the square root of the relative permittivity. Alternatively, for fixed dimensions, it enables the operating frequency to be reduced by the same factor.

The resonant element 18 may include a dielectric medium, for example but not limited to a single crystal material. Examples of possible materials include single crystal titanium dioxide and single crystal strontium titanate.

In alternative embodiments the resonant element 18 may include a sintered oxide polycrystalline ceramic, or a polymer or polymer composite material, or a metal or metallodielectric structure.

Further Features and Options

In relation to all the embodiments described above, the maser structure 10 may be provided with temperature stabilisation means, for example but not limited to a Peltier element, a Stirling cycle cooler, a pulse tube cooler, or a Gifford-McMahon cooler. Thermal management means, for example but not limited to a supply of forced gas or forced air, may also be provided.

Although the maser structure 10 is illustrated and described above as having an outer casing 12 around the resonant element 18, this is optional, and embodiments may be produced having no outer casing around the resonant element 18. If an outer casing is used, it preferably comprises an electrically conducting material.

The transition frequency of the triplet state of the gain medium 16 may be tuned by the application of a magnetic field to the gain medium. The magnetic field may be provided by a permanent magnet such as ferrite or neodymium iron boron, or by passing an electric current through a coil in close proximity to the gain medium 16.

Moreover, the resonant frequency of the overall resonator structure 14 may be tuned by providing it with an adjustable top or bottom wall, and/or an adjustable side wall, that can be moved towards or away from the gain medium 16 and the resonant element 18. Alternatively, a tuning screw—that is, a screw or post inserted with variable penetration into the electromagnetic field of the resonator structure—can be adjusted in order to tune the resonant frequency.

EXAMPLES

The following examples outline experiments that demonstrate an increase in magnetic Purcell factor on increasing the relative permittivity of the dielectric material used. Finally, a split-ring resonator will demonstrate how a further enhancement in the magnetic Purcell factor can be achieved. By increasing the magnetic Purcell factor in such a manner, a reduction in the required optical pumping power can be achieved.

The experiments in Examples 1 to 3 were conducted by placing a cylindrical ring of single crystal dielectrics on a low-permittivity support post (such as quartz, PTFE or polystyrene) inside a cylindrical copper cavity. The dielectric materials used have increasing relative permittivity ranging from 9.6 to 400 and show how the magnetic Purcell factor increases as a result. Although single crystals were used, sintered polycrystalline ceramics would also function similarly. In Example 4, a copper film patterned into a split-ring was deposited upon a high-permittivity substrate and also housed within a cylindrical copper cavity. Two coupling loops enter the cavity and are attached by cables to a vector network analyser with 1 Hz resolution. Example 4 demonstrates a significant increase in the magnetic Purcell factor achieved, as a result of introducing a metallic loop structure to the resonant element, in comparison to Examples 1-3 which do not include such a structure.

Example 1

A cylindrical single-crystal of $Al_2O_3$ with external diameter 73 mm, internal diameter 10 mm and height 35 mm was placed upon a quartz spacer within a copper cavity with diameter 150 mm and height 74 mm. The resonant frequency of the $TE_{01\delta}$ mode was measured at 1.45 GHz with an unloaded Q-factor of 169,600. The magnetic mode volume was calculated to be 58.6 cm$^3$, yielding a magnetic Purcell factor of $3 \times 10^3$ cm$^{-3}$.

Example 2

A cylindrical single-crystal of $TiO_2$ with external diameter 22 mm, internal diameter 3 mm and height 13 mm was placed upon a quartz spacer within a copper cavity with diameter 94 mm and height 60 mm. The resonant frequency of the $TE_{01\delta}$ mode was measured at 1.48 GHz with an unloaded Q-factor of 37,000. The magnetic mode volume was calculated to be 1.3 cm$^3$, yielding a magnetic Purcell factor of $29 \times 10^3$ cm$^{-3}$.

Example 3

A cylindrical single-crystal of $SrTiO_3$ with external diameter 10 mm, internal diameter 3 mm and height 12 mm was placed upon a quartz spacer within a copper cavity with diameter 52 mm and height 30 mm. The resonant frequency of the $TE_{01\delta}$ mode was measured at 1.53 GHz with an unloaded Q-factor of 10,060. The magnetic mode volume was calculated to be 0.2 $cm^3$, yielding a magnetic Purcell factor of $53 \times 10^3$ $cm^{-3}$.

Example 4

A split-ring resonator comprising a 100 μm thick copper ring with external diameter 18 mm and internal diameter 10 mm, possessing a single cut through one side of width 100 μm, was placed upon a $TiO_2$ substrate of height 9 mm and housed within a copper cavity with diameter 36 mm and height 18 mm. The resonant frequency was 1.45 GHz and the unloaded Q factor was 1,200. The magnetic mode volume was measured to be $10^{-4}$ $cm^3$, resulting in a magnetic Purcell factor of $12 \times 10^6$ $cm^{-3}$.

REFERENCES

[1] Blank, A. & Levanon, H., "Toward maser action at room temperature by triplet-radical interaction and its application to microwave technology", RIKEN Review 44, February 2002, 128-130.

[2] Ygal Twig, E Suhovoy, A Blank "Review of scientific instruments" 81 104703 (2010).

The invention claimed is:

1. A device for generating stimulated emission of microwave or radio frequency electromagnetic radiation, the device comprising:
a resonator structure comprising a resonant element and a gain medium;
an input source of microwave or radio frequency electromagnetic radiation to he amplified; and
an input of energy arranged to pump the resonator structure and thereby cause amplification of the electromagnetic radiation;
wherein the resonant element comprises an electrically inductive metallic loop structure having one or more half-turns, and an electrically capacitive structure.

2. A device as claimed in claim 1, wherein the resonant element comprises a split-ring, hairpin or LC resonator; and wherein the electrically capacitive structure comprises a gap, a slot, or parallel plates.

3. A device as claimed in claim 1, wherein the electrically inductive metallic loop structure is formed of gold, silver, or copper.

4. A device as claimed in claim 1, wherein the electrically inductive metallic loop structure is formed as a metallic layer.

5. A device as claimed in claim 4, wherein the metallic layer is disposed on a substrate, the substrate comprising a material having a relative permittivity greater than 10.

6. A device as claimed in claim 4, wherein the metallic layer is disposed on a substrate, the substrate comprising a material having a relative permittivity greater than 20.

7. A device as claimed in claim 4, wherein the metallic layer is disposed on a substrate, the substrate comprising a material selected from a group comprising: a dielectric medium; a single crystal material; a single crystal ceramic; a sintered oxide polycrystalline ceramic; a polymer; a polymer composite material; a metal; a metallodielectric structure; and a printed circuit board material.

8. A device as claimed in claim 1, wherein the electrically inductive metallic loop structure is a first electrically inductive metallic loop structure, the resonant element further comprising a second electrically inductive metallic loop structure arranged within the first electrically inductive metallic loop structure; wherein the first and second electrically inductive loop structures are arranged concentrically and each comprises a respective gap or slot, the respective gaps or slots being arranged on mutually opposing sides of the resonant element.

9. A device as claimed in claim 1, wherein the gain medium is disposed within the resonant element in one or more regions of relatively high magnetic field density within the resonant element.

10. A device as claimed in claim 1, wherein the gain medium contains a polyaromatic hydrocarbon.

11. A device as claimed in claim 10, wherein the gain medium contains p-terphenyl doped with pentacene.

12. A device as claimed in claim 1, wherein the resonator structure has a magnetic Purcell factor of the order of $10^7$ $cm^{-3}$.

13. A device for generating stimulated emission of microwave or radio frequency electromagnetic radiation, the device comprising:
a resonator structure comprising a gain medium disposed within a resonant element;
an input source of microwave or radio frequency electromagnetic radiation to be amplified; and
an input of energy arranged to pump the gain medium and thereby cause amplification of the electromagnetic radiation;
wherein the resonant element comprises a material having a relative permittivity greater than 13.

14. A device as claimed in claim 1, wherein the stimulated emission of electromagnetic radiation is at a frequency in the range of 1 kHz to 300 GHz.

15. A device as claimed in claim 14, wherein the stimulated emission of electromagnetic radiation is at a microwave frequency.

16. A device as claimed in claim 14, wherein the stimulated emission of electromagnetic radiation is at a radio frequency.

17. A device as claimed in claim 1, further comprising a temperature stabilization or thermal management apparatus.

18. A device as claimed in claim 17, wherein the temperature stabilization or thermal management apparatus is selected from a group comprising: a Peltier element; a Stirling cycle cooler; a pulse tube cooler; forced air or gas cooling; and a Gifford-McMahon cooler.

19. A device as claimed in claim 1, having no outer casing around the resonant element.

20. A device as claimed in claim 1, further comprising apparatus for applying a magnetic field to the gain medium.

21. A device as claimed in claim 20, wherein said apparatus for applying the magnetic field is selected from a group comprising: a permanent magnet; and a coil through which an electric current may be passed.

22. A device as claimed in claim 1, further comprising apparatus for tuning the resonant frequency of the resonator structure.

23. A device as claimed in claim 22, wherein said apparatus for tuning the resonant frequency is selected from a group comprising: an adjustable wall; and a tuning screw.

24. A method of generating stimulated emission of microwave or radio frequency electromagnetic radiation, the method comprising:
providing a resonator structure comprising a resonant element and a gain medium;

supplying, to the resonator structure, microwave or radio frequency electromagnetic radiation to be amplified; and pumping the resonator structure with an input of energy and thereby causing amplification of the electromagnetic radiation;

wherein the resonant element comprises an electrically inductive metallic loop structure having one or more half-turns, and an electrically capacitive structure;

or alternatively wherein the method comprises:

providing a resonator structure comprising a gain medium disposed within a resonant element;

supplying, to the resonator structure, microwave or radio frequency electromagnetic radiation to be amplified; and pumping the gain medium with an input of energy and thereby causing amplification of the electromagnetic radiation;

wherein the resonant element comprises a material having a relative permittivity greater than 13.

* * * * *